(12) United States Patent
Farooq et al.

(10) Patent No.: US 11,682,640 B2
(45) Date of Patent: Jun. 20, 2023

(54) PROTECTIVE SURFACE LAYER ON UNDER BUMP METALLURGY FOR SOLDER JOINING

(71) Applicant: INTERNATIONAL BUSINESS MACHINES CORPORATION, Armonk, NY (US)

(72) Inventors: Mukta Ghate Farooq, Hopewell Junction, NY (US); James J. Kelly, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 17/103,810

(22) Filed: Nov. 24, 2020

(65) Prior Publication Data

US 2022/0165691 A1     May 26, 2022

(51) Int. Cl.
| | |
|---|---|
| H01L 25/065 | (2023.01) |
| H01L 23/00 | (2006.01) |
| H01L 25/00 | (2006.01) |
| H01L 21/683 | (2006.01) |
| H01L 21/768 | (2006.01) |

(52) U.S. Cl.
CPC .......... *H01L 24/05* (2013.01); *H01L 21/6835* (2013.01); *H01L 21/76898* (2013.01); *H01L 24/03* (2013.01); *H01L 25/0652* (2013.01); *H01L 25/50* (2013.01); *H01L 2221/68372* (2013.01); *H01L 2224/0345* (2013.01); *H01L 2224/03462* (2013.01); *H01L 2224/0401* (2013.01); *H01L 2224/0569* (2013.01); *H01L 2224/05084* (2013.01); *H01L 2224/05147* (2013.01); *H01L 2224/05155* (2013.01);
(Continued)

(58) Field of Classification Search
CPC ... H01L 2224/0401; H01L 2224/05147; H01L 2224/05166; H01L 2224/05666
See application file for complete search history.

(56) References Cited

U.S. PATENT DOCUMENTS

| | | |
|---|---|---|
| 3,839,727 A | 10/1974 | Herdzik et al. |
| 5,086,966 A | 2/1992 | Melton et al. |

(Continued)

FOREIGN PATENT DOCUMENTS

| | | |
|---|---|---|
| CN | 1503328 A | 6/2004 |
| CN | 101330065 A | 12/2008 |

(Continued)

OTHER PUBLICATIONS

International Search Report and Written Opinion dated Jan. 19, 2022 in related application No. PCT/CN2021/125117; 11 pgs.

*Primary Examiner* — Dale E Page
*Assistant Examiner* — Wilner Jean Baptiste
(74) *Attorney, Agent, or Firm* — Intelletek Law Group, PLLC; Gabriel Daniel, Esq.

(57) ABSTRACT

A method of fabricating an under-bump metallurgy (UBM) structure that is free of gold processing includes forming a titanium layer on top of a far back of line (FBEOL) of a semiconductor. A first copper layer is formed on top of the titanium layer. A photoresist (PR) layer is formed on top of the first copper layer between traces of the FBEOL to provide a cavity to the FBEOL traces. A top copper layer is formed on top of the first copper layer. A protective surface layer (PSL) is formed on top of the top copper layer.

8 Claims, 12 Drawing Sheets

(52) U.S. Cl.
CPC ............... *H01L 2224/05166* (2013.01); *H01L 2224/05562* (2013.01); *H01L 2224/05573* (2013.01); *H01L 2224/05657* (2013.01); *H01L 2224/05663* (2013.01); *H01L 2224/05664* (2013.01); *H01L 2224/05666* (2013.01); *H01L 2224/05669* (2013.01); *H01L 2224/05671* (2013.01); *H01L 2224/05673* (2013.01); *H01L 2224/05676* (2013.01); *H01L 2224/05678* (2013.01); *H01L 2224/05684* (2013.01); *H01L 2225/06513* (2013.01); *H01L 2225/06541* (2013.01); *H01L 2225/06582* (2013.01); *H01L 2924/01015* (2013.01); *H01L 2924/01022* (2013.01); *H01L 2924/01024* (2013.01); *H01L 2924/01027* (2013.01); *H01L 2924/01044* (2013.01); *H01L 2924/01045* (2013.01); *H01L 2924/01046* (2013.01); *H01L 2924/01074* (2013.01); *H01L 2924/01076* (2013.01); *H01L 2924/01077* (2013.01); *H01L 2924/01078* (2013.01)

(56) References Cited

U.S. PATENT DOCUMENTS

| | | |
|---|---|---|
| 5,755,859 A | 5/1998 | Brusic et al. |
| 6,312,830 B1 | 11/2001 | Li et al. |
| 6,335,104 B1 | 1/2002 | Sambucetti et al. |
| 6,445,069 B1 * | 9/2002 | Ling .................... H01L 24/13 |
| | | 257/E21.174 |
| 6,574,859 B2 | 6/2003 | Farooq et al. |
| 7,115,496 B2 | 10/2006 | Brintzinger et al. |
| 7,703,661 B2 | 4/2010 | Hougham et al. |
| 8,324,738 B2 | 12/2012 | Liu et al. |
| 8,415,243 B1 * | 4/2013 | Kuo ..................... H01L 24/11 |
| | | 257/737 |
| 8,492,891 B2 | 7/2013 | Lu et al. |
| 9,275,965 B2 | 3/2016 | Hwang et al. |
| 2008/0136019 A1 * | 6/2008 | Johnson ............... H01L 24/13 |
| | | 257/737 |
| 2011/0186989 A1 | 8/2011 | Hsiao et al. |
| 2012/0064712 A1 | 3/2012 | Lei et al. |
| 2013/0026622 A1 | 1/2013 | Chuang et al. |

FOREIGN PATENT DOCUMENTS

| | | |
|---|---|---|
| CN | 102148201 A | 8/2011 |
| CN | 102403243 A | 4/2012 |
| CN | 102005417 B | 1/2013 |
| CN | 102903690 A | 1/2013 |
| CN | 102347298 B | 8/2016 |

* cited by examiner

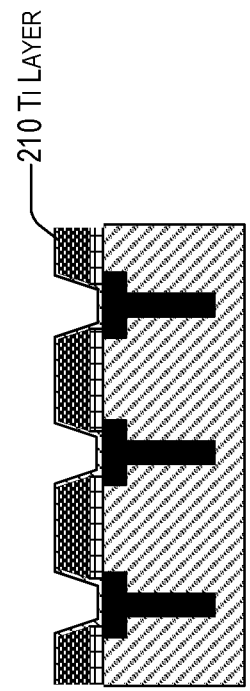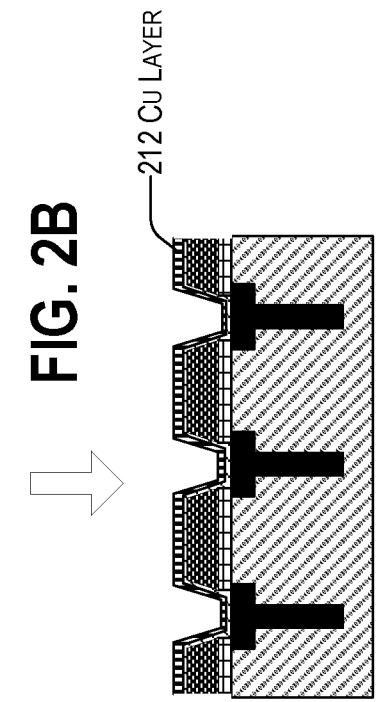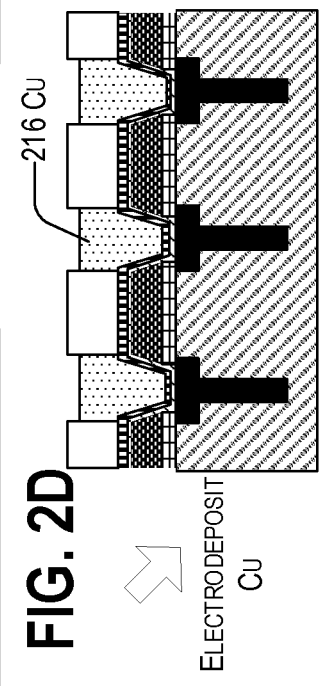

TABLE LISTING EXAMPLE REMOVABLE PSLS, DEP METHOD, REMOVAL METHOD (SI FAB COMPATIBLE)

| PSL | Deposition Method | Selective? | Removal Method |
|---|---|---|---|
| Ti | PVD | | Wet (HF) |
| TiW | PVD | N | Wet (HF/nitric, peroxide, etc.)/RIE |
| Cr | | | K permanganate |
| Co | CVD | Y | Wet (e.g., sulfuric/peroxide) |
| Co | electroless | Y | Wet (e.g., sulfuric/peroxide) |
| CoWP | | | |
| BTA/organic preservative | Wet immersion | N | Solvent followed by sulfuric/peroxide |

FIG. 10

TABLE LISTING EXAMPLE PERMANENT PSLS, DEP METHOD (Si FAB COMPATIBLE)

| PSL | Deposition Method | Selective? | Comments |
|---|---|---|---|
| Ru | CVD | Y | Can be used in BEOL R&D work (CVD processes available) |
| Rh | Wet immersion | Y | Replacement plating |
| Ir | Wet immersion | Y | Replacement plating |
| Os | CVD/wet immersion | Y | CVD discussed in literature |
| Pd | Wet immersion | Y | Available as wet immersion |
| Pt | Wet immersion | Y | Used previously in silicide work |

FIG. 11

PROTECTIVE SURFACE LAYER ON UNDER BUMP METALLURGY FOR SOLDER JOINING

BACKGROUND

Technical Field

The present disclosure generally relates to semiconductor devices, and more particularly, to creating solder joining interfaces where gold is not desired and methods of manufacturing the same.

Description of the Related Art

Today, integrated circuits are typically produced on semiconductor wafers that undergo various processing steps. Integrated circuits typically include active devices, such as transistors, inductors, capacitors, etc., which are initially isolated, but are interconnected to form functional circuits during these processing steps. To that end, horizontal metal lines as well as vertical interconnects (e.g., vias) can be used. On top of the interconnect structures, solder joining interfaces such as bond pads are formed and exposed on the surface of the respective chip. Electrical connections are made through bond pads to connect the chip to a package substrate or another die. Bond pads can be used for wire bonding or flip-chip bonding, sometimes referred to as controlled collapse chip connection (C4). Such flip-chip packaging uses bumps to establish electrical contact between a chip's I/O pads and the substrate or lead frame of the opposing package. Structurally, a bump includes the bump itself and a so-called under bump metallurgy (UBM) located between the bump and an I/O pad. Receiving pads that accept solder ball during joining/attachment typically have a coating of gold to provide a layer of protection, such that subsequent bonding is not inhibited. The gold layer is easily absorbed into the solder joint during the soldering process.

An UBM generally includes an adhesion layer, a barrier layer and a wetting layer, arranged in this order on the I/O pad. The bumps themselves, based on the material used, are classified as solder bumps, gold bumps, copper pillar bumps and bumps with mixed metals. Copper can be used as an interface to accept the solder balls. However, copper has a tendency to be oxidized during manufacturing processes. The oxidized copper post may lead to poor adhesion of the electronic component to a substrate. The poor adhesion may result in reliability concerns. The oxidized copper post may also lead to underfill cracking along the interface of the underfill and the copper post. The cracks may propagate to low-k layers or the solder used to bond the copper post to the substrate. Gold is typically used as a protective layer to prevent oxidation of the UBM.

SUMMARY

According to one embodiment, an under-bump metallurgy (UBM) structure that is free of gold processing includes a titanium layer on top of a metal layer of a semiconductor. A first copper layer is on top of the titanium layer. A protective surface layer (PSL) is on top of the first copper layer.

In various embodiments, the PSL is selective or non-selective.

In one embodiment, a second copper layer is on top of the first copper layer and below the top copper layer. There may be a nickel layer on top of the second copper layer. The top copper layer may be directly on top of the nickel layer.

In one embodiment, the PSL is removed before the UBM accepts a solder ball to connect to a second semiconductor structure. The PSL can be selected from: titanium (Ti); tungsten-titanium (TiW); chromium (Cr); cobalt (Co); cobalt/tungsten/phosphorus (CoWP); and benzotriazole (BTA).

In one embodiment, the PSL is configured not to be removed before the PSL accepts a solder ball to connect to a second semiconductor structure. The PSL can be selected from: ruthenium (Ru); rhodium (Rh); iridium (Ir); osmium (Os); palladium (Pd); and platinum (Pt).

According to one embodiment, a method of fabricating an under-bump metallurgy (UBM) structure that is free of gold processing includes forming a titanium layer on top of the far back end of the line (BEOL) metal level of a semiconductor. A first copper layer is formed on top of the titanium layer. A photoresist (PR) layer is formed on top of the first copper layer between traces of a metal wiring of the semiconductor to provide a cavity to the metal wiring traces. A top copper layer is formed on top of the first copper layer. A protective surface layer (PSL) is formed on top of the top copper layer.

In one embodiment, a nickel (Ni) layer is deposited on top of the first or second copper layer and below a final top copper layer. The Ni layer may have a thickness of 1 um to 3 um. A second copper layer that is on top of the first copper layer and below the Ni layer can be formed.

In one embodiment, the PSL is removed before the UBM accepts a solder ball to connect to a second semiconductor structure.

In one embodiment, the semiconductor is connected to a second semiconductor by way of a solder bond between the semiconductor and the second semiconductor. The connection may be one of a die to die (D2D), a wafer to wafer (W2W), or die to wafer (D2W).

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIGS. 2A to 2H show different processing steps in the formation of an under-bump metallurgy (UBM) for non-selectively deposited protective surface layer and selectively deposited protective surface layer, respectively, consistent with illustrative embodiments.

FIG. 10 provides a table of example removable protective surface layers, deposition methods, and removal thereof.

FIG. 11 provides a table of different deposition methods of identified protective surface layer materials.

DETAILED DESCRIPTION

Overview

Figure 1:
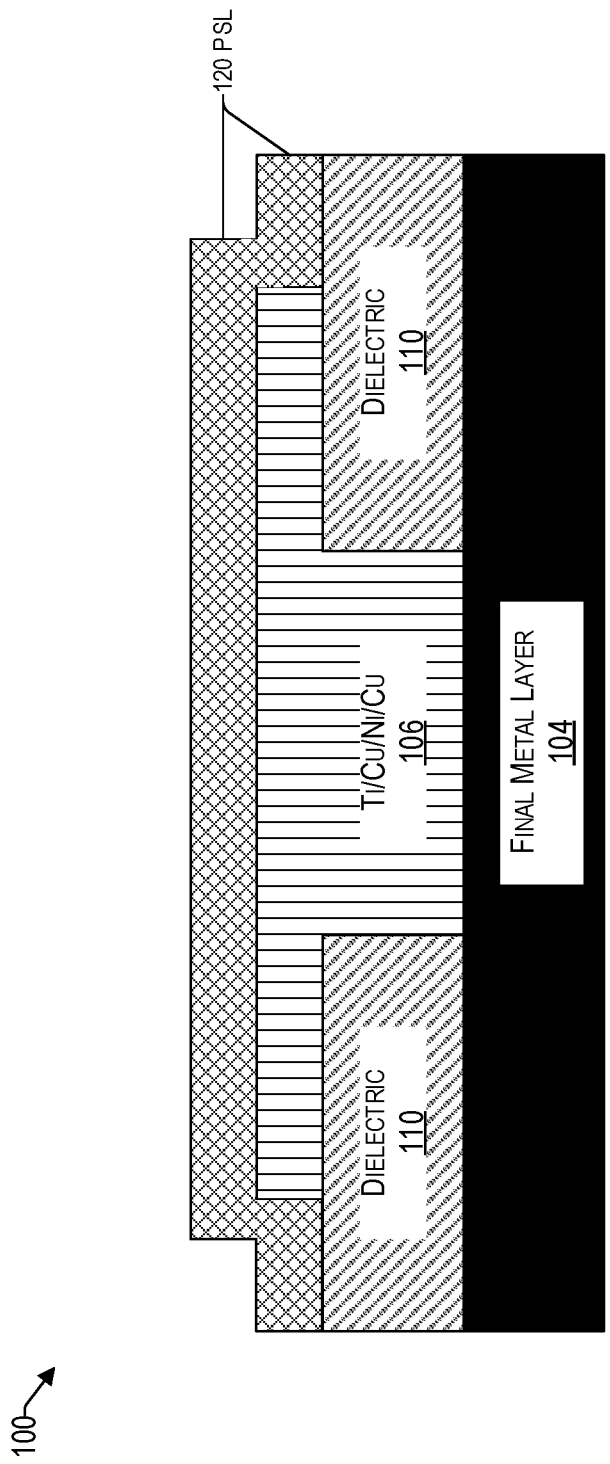
FIG. 1 is a cross-section view of a top surface of a semiconductor pad configured to receive a solder ball, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a semiconductor substrate or semiconductor body. For example, substrate can be the surface of a wafer or a die.

As used herein, the term "vertical" describes an orientation that is arranged perpendicular to the first surface of the semiconductor substrate or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

In the interest of not obscuring the presentation of embodiments of the present disclosure, some processing steps or operations may have been combined together for presentation and for illustration purposes and in some instances may have not been described in detail. In other instances, some processing steps or operations may not be described at all. It should be understood that the following description is rather focused on the distinctive features or elements of various embodiments of the present disclosure.

The present invention relates generally to semiconductor structures and methods of manufacture and, more particularly, to providing a protective layer to solder balls in environments where gold is not desired during processing. Today, integrated circuits communicate with devices outside of the chip by way of bond pads. In some scenarios, silicon is joined with silicon by way of under bump metallurgy (UBM) located between the bump and an I/O pad. Receiving pads that accept solder ball during joining/attachment typically have a coating of gold to provide a layer of protection, such that the pads are not contaminated during processing, before the silicon is joined with silicon. The bumps themselves, based on the material used, are classified as solder bumps, gold bumps, copper pillar bumps, as well as bumps with mixed metals. Many of these materials are subject to oxidation, which may lead to poor adhesion when silicon is coupled to silicon to create 3D structures. The poor adhesion causes reliability concerns, such as high leakage currents and poor signal transfer. Such pads that accept solder ball(s) during joining/attachment typically have a coating of gold on their top surface. However, gold processing is not possible in all fab environments. For example, gold can diffuse into Si devices and poison their electrical properties. What is provided herein are structures and methods of solderable receiving pads that are free of gold processing. A protective surface layer allows for a clean solderable surface on a receiving pad that can be applied in most semiconductor fabrication and/or outsourced assembly and test (OSAT) environments.

The techniques described herein may be implemented in a number of ways. Example implementations are provided below with reference to the following figures.

Example PSL Structure

FIG. 1 is a cross-section view of a top surface of a semiconductor pad configured to receive a solder ball, consistent with an illustrative embodiment. The semiconductor structure 100 relates to an under-bump metallization (UBM) of an integrated circuit (IC), which is part of an advanced packaging process that involves creating a thin film metal layer stack between the IC or metal pillars and solder bumps in a flip chip package. The UBM is a structure on top of a far back end of the line (FBEOL) stack of a semiconductor. The level 104, representing the final metal wiring layer of the of the FBEOL, may be aluminum (Al) or copper (Cu). There is a titanium layer on top of the FBEOL of the semiconductor. There is a first copper layer (212) on top of the titanium layer. In one embodiment, there is a second copper layer (216) on top of the first copper layer (212). There is a nickel layer (218) on top of the second copper layer. In some embodiments, there is a top copper layer on top of the second copper layer. There is a patterned dielectric layer 110, which may be polyimide, which is used to create regions where the UBM discussed herein is formed. The openings created by the dielectric layer 110 define the wettable area for joining with another silicon. A protective surface layer (PSL) 120 is then formed thereon. The structure 200 is ready to receive a solder bond without worry of corrosion and/or contamination of the UBM, thereby providing a reliable solderable surface. Significantly, no gold is used in the formation of the UBM structure or protection thereof. In various embodiments, the PSL is resistant to oxygen plasma reactive ion etch (RIE), is immiscible with copper (Cu), is immiscible with adhesive, resistant to solvent cleaning (e.g., N-methylpyrrolidone (NMP)), and can even be readily removed using a chemical that does not attack the Cu below it. The materials and the manufacturing process related to the PSL are discussed in more detail later.

Example Formation of the PSL Structure

Figure 2F:
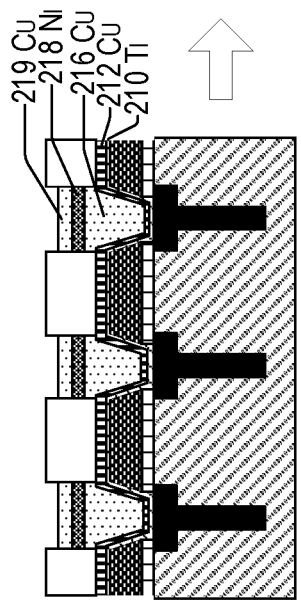

Reference now is made to FIGS. 2A to 2H, which show different processing steps in the formation of a UBM for non-selectively deposited PSL and selectively deposited PSL, respectively, consistent with illustrative embodiments. As illustrated in FIG. 2A, after forming the last (or "far") back end of the line (FBEOL) metal wiring levels (e.g., 208), the wafer is encapsulated in a final layer of silicon nitride (e.g., nitride passivation 204). Various known semiconductor deposition technique can be used, such as chemical vapor deposition (CVD) to deposit the silicon nitride 204. In one embodiment, the last metal wiring level 208 is either Cu or Al and provides connectivity to the back side of the wafer by way of through silicon vias (e.g., 202).

After the nitride 204 deposition step, a layer of dielectric (which can be polyimide) 206 is deposited and patterned to expose the sections of the uppermost FBEOL 208 metal structures that will receive the solder connections of the second chip to be joined, sometimes referred to herein as the second silicon.

FIG. 2B illustrates a layer of Ti (e.g., ~100 to 300 nm in thickness) being deposited on top of the polyimide layer 206. FIG. 2C illustrates a second layer of Cu (e.g., ~100 to 400 nm), which, in one embodiment, is deposited by physical vapor deposition (PFD), sometimes referred to as sputtering, on top of the Ti layer 210. For example, the Ti layer 210 serves as a Cu diffusion barrier and adhesion layer, while the Cu is the seed layer for the subsequent electroplating step.

FIG. 2D illustrates a deposition of a photoresist (PR) 214. Standard techniques can be used for the patterning of the PR 214. In one embodiment, a layer of Cu (e.g., ~1-10 um) 216 is electrodeposited to build up Cu pad structures, as illustrated in FIG. 2E. In an alternative embodiment of FIG. 2F, a pad structure comprising a first electrodeposited Cu layer 216 (e.g., 1-3 um), followed by a plated Ni layer 218 (e.g., 1-3 um), and a final Cu top layer (e.g., 1-3 um) 219 is employed. For example, these layers are formed by a sequential plating of Cu 216, Ni 218, and then Cu 219.

Figure 2G:
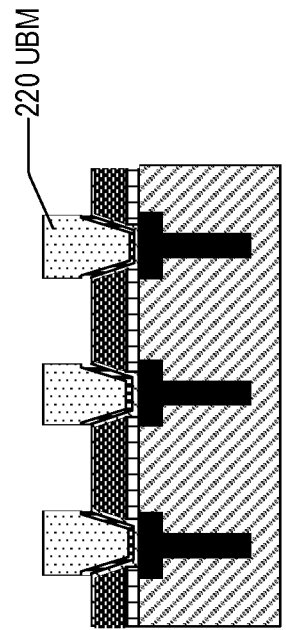
Figure 2H:
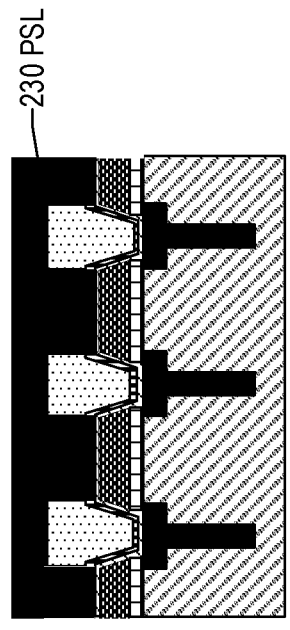

FIG. 2G illustrates a subsequent stripping of the PR layer 214 with a solvent, which may be followed by a chemical etch that is operative to remove the Cu seed 216 and Ti 210 layers between the Cu pad structures. Since the wet etch is optimized to have minimal undercut of the pads, the Cu and Ti beneath the pads is not appreciably etched. This top metal structure contacting the last FBEOL metal level is known as the under-bump metallurgy (UBM) 220 since it will be beneath the solder once the second chip is joined to the current chip.

Next, the protective surface layer PSL 230 is deposited on top of the UBM structures. For non-selective deposition, the protective surface layer (PSL) coats the entire top surface of the wafer, while selectively deposited layers only grow on the top surface of the Cu owing to its catalytic nature. The PSL protects the UBM from corrosion during processing until the UBM receives a solder ball such that another wafer or chip is coupled thereon.

Example Process

Figure 3:
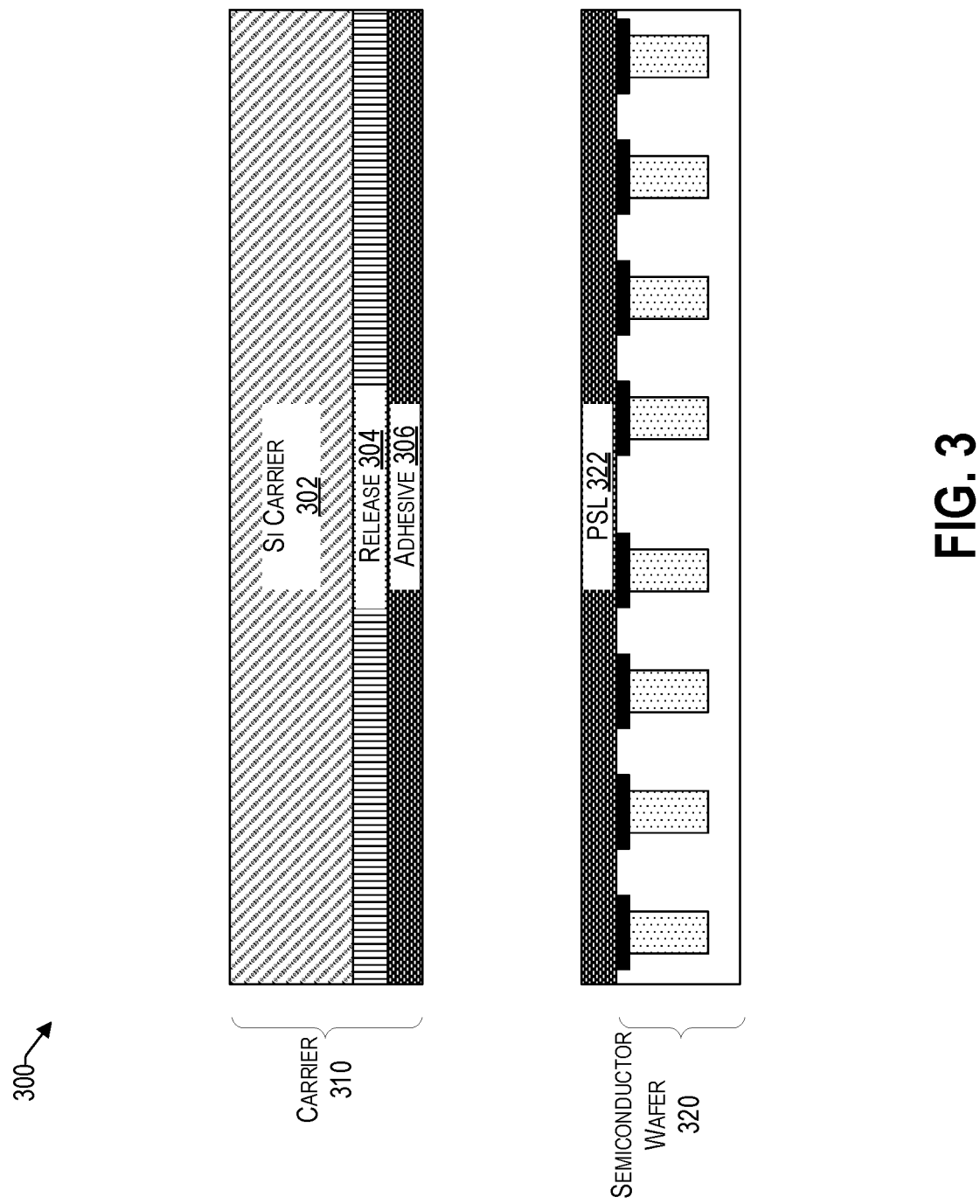
FIG. 3 illustrates a carrier structure aligned above a semiconductor wafer, consistent with an illustrative embodiment.

With the foregoing description of a PSL structure 100 of FIG. 1 and the formation thereof as discussed in the context of FIGS. 2A to 2G, reference now is made to FIGS. 3 to 9, which describe different processing steps in a 3D wafer flow for a TSV structure. FIG. 3 illustrates an arrangement 300 of a carrier structure 310 aligned above a semiconductor wafer 320, consistent with an illustrative embodiment. The carrier 310 (sometimes referred to herein as a carrier wafer or handler) may comprise a material such as undoped or lightly doped silicon, as well as glass. In some embodiments, the carrier wafer 310 is transparent to infrared (IR) radiation. The carrier 302 may have a height ranging from approximately 400 μm to approximately 1000 μm and an overall diameter that corresponds to the diameter of a corresponding semiconductor wafer 320 that is later coupled thereto. It should be noted that the thickness of the handler can vary depending on its diameter and the requirements for structural stability. The carrier structure 310 includes a carrier wafer 302, a release layer 304 formed on a bottom surface of the carrier 302 and an adhesive layer 306 formed on a bottom surface of the release layer 304.

In various embodiments, the release layer 304, sometimes referred to herein as the sacrificial layer, may be severable by way of a chemical process and/or infrared (IR) radiation. For the latter, the release layer 304 may be aluminum (Al) or any other Light-To-Heat-Conversion Release Coating (LTHC) layer that is able to absorb IR radiation efficiently (e.g., materials with a higher IR absorption performance are preferred, but materials with lower IR absorption performance need not be excluded). The release layer 304 may be deposited on the bottom surface of the carrier 302 (e.g., below the IR coating 202), using a conventional deposition technique, such as, without limitation, chemical vapor deposition (CVD), plasma enhanced CVD (PECVD), thermal CVD (THCVD), sputtering, spin-on deposition, etc. In one embodiment, the carrier wafer 302, adhesive layer 306, and the PSL are each 400C resistant.

The semiconductor wafer 320 may be a typical wafer and may include multiple layers and materials. The multiple layers may comprise semiconductor materials, dielectric materials, and conductive materials. The semiconductor materials may include any known semiconductor materials, such as, for example, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Non-limiting examples of compound semiconductor materials include gallium arsenide, indium arsenide, and indium phosphide. Typically, the semiconductor wafer may be, for example, several hundred microns thick and may have been thinned from 780 um to approximately 100 um or lower.

In various embodiments, the semiconductor wafer 320 may include various circuits and structures consistent with integrated circuits. The semiconductor wafer 320 includes a PSL 322 on its top side, facing the adhesive layer 306 of the carrier structure 310. The different compositions of the PSL 322, the corresponding deposition method, selectivity, and removal thereof are provided in FIG. 10. Selectivity relates to whether there is a blanket approach toward the entire wafer/chip or the layer is formed with a specific pattern. Before the wafer or chip is coupled to another wafer or chip, the PSL is removed to allow a strong and reliable bond between the two pieces of silicon. In this regard, FIG. 10 provides a table 1000 of example removable PSLs, deposition methods, and removal thereof. The fourth column of table 1000 provides example ways of removing the PSL. It should be noted that the combination of materials, deposition methods, and removal thereof are provided by way of example and not limitation. FIG. 11 provides a table 1100 of different deposition methods of specific PSL material. The materials provided in table 1100 represent permanent PSLs, which need not be removed before soldering. Some alloys may form intermetallics with Sn, thereby improving solder joint quality.

Figure 4:
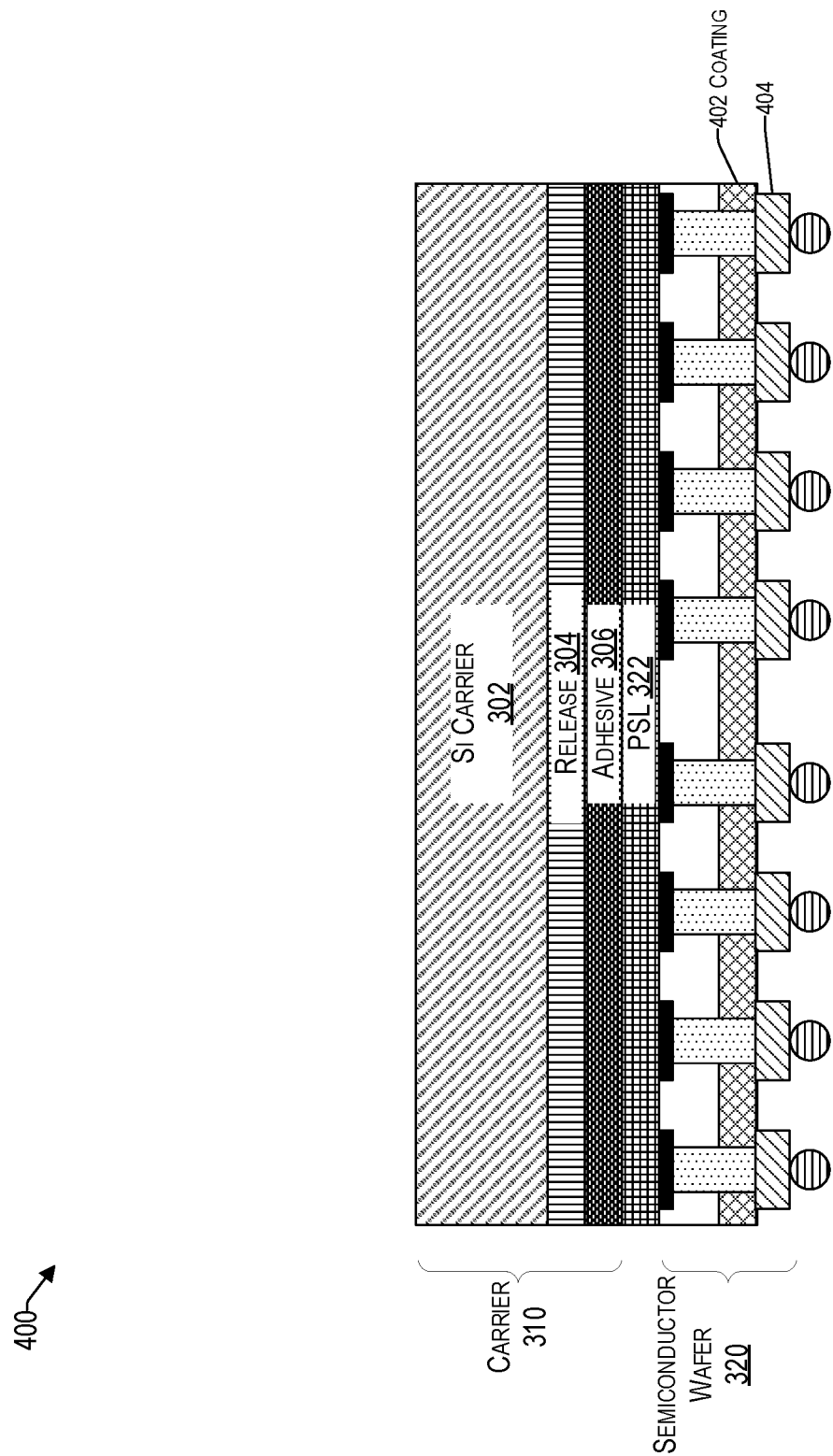
FIG. 4 illustrates a semiconductor structure of a carrier structure that is bonded to a semiconductor wafer, consistent with an illustrative embodiment.

FIG. 4 illustrates a semiconductor structure 400 of a carrier structure 310 that is bonded to the semiconductor wafer 320, consistent with an illustrative embodiment. Upon aligning the carrier structure 310 with the semiconductor wafer 320, the adhesive layer 306 is used to connect to the PSL 322 on top of the semiconductor wafer 320. By virtue of coupling the carrier structure 310 to the semiconductor wafer, various desired semiconductor processing steps can be performed, which would not have been able to without the additional structural support offered by the carrier structure 310, in view of the fragility of the semiconductor wafer 320 independently. For example, the thickness of the semiconductor wafer 320 can be substantially reduced by way of a backside thinning (e.g., from 780 um to 100 um). Various appropriate techniques, such as grinding, can be used to thin the semiconductor wafer 320. In this way, the through silicon vias (TSV) can be captured and coupled to pads, a redistribution layer (RDL) provided, flip chip (C4) compatible structure provided (e.g., Cu pedestal/pillar and solder cap 404), etc. There is a coating layer 402, which may be a silicon nitride, which is used to protect and seal the semiconductor wafer 320 and the TSV's mechanical integrity during a TSV reveal and capture process. In other embodiments, coating layer 402 can also be any other dielectric material that has a predetermined level of electrical barrier properties and mechanical strength (e.g., silicon oxynitrides, silicon carbonitrides, and other similar materials not based on silicon). For simplicity and to avoid clutter, a non-selective PSL 322 is illustrated in FIG. 4, while it will be understood that a selective PSL is supported by the teachings herein as well.

Figure 5:
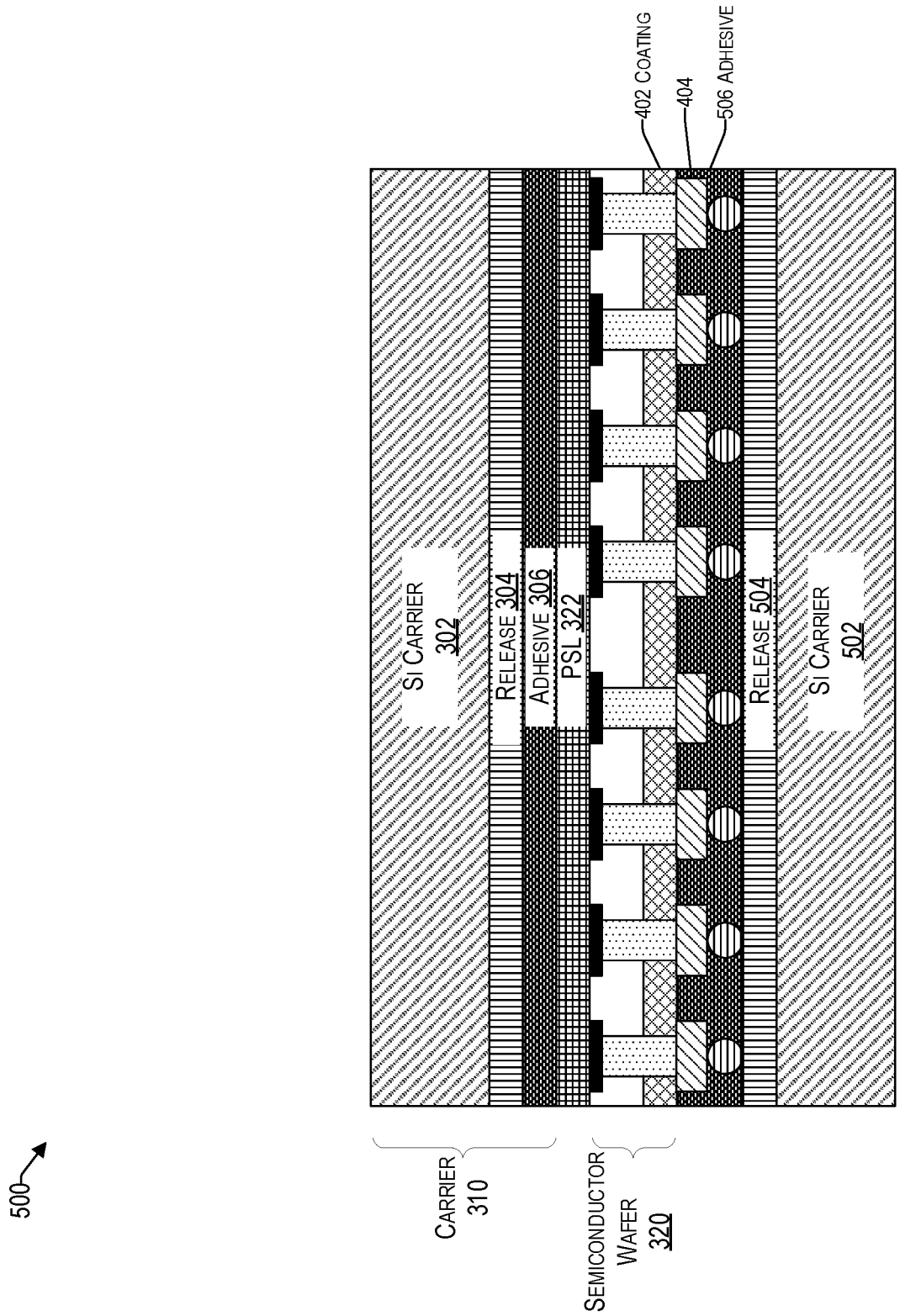
FIG. 5 illustrates a semiconductor structure that includes a second carrier coupled to the semiconductor structure of FIG. 4, consistent with an illustrative embodiment.

In some scenarios, the semiconductor structure 400 can be further enhanced by further processing to add and/or add additional functionality to the circuits of the semiconductor wafer 320. In this regard, FIG. 5 illustrates a semiconductor structure that includes a second carrier 502 coupled to the semiconductor structure of FIG. 4, consistent with an illustrative embodiment. In various embodiments, the second carrier can be aligned and held together by tape or any appropriate adhesive 606 (e.g., to maximize flexibility in processing depending on the application, especially in cases where high topography may require the use of an adhesive layer), which may be removable by subsequent laser and/or chemical processes. In this way, the first carrier structure 310 can later be removed, while maintaining the structural integrity of the semiconductor wafer 320 for further processing. Further processing can include, for example, additional wafers coupled and in electrical communication with the semiconductor wafer 320. In some embodiments, the second carrier 502 includes a release layer 504 on a top surface of the second carrier 502. The release layer 502, sometimes referred to herein as the second release layer with reference to the first release layer 304, can be de-bonded by way of laser and/or chemical processes. For example, the amount of energy applied by a laser to de-bond the first release layer 304 may be different from that of the second release layer 504. In other example, the chemical process to de-bond the first release layer 304 is different from that of the second release layer 504, thereby controlling which release layer to be released at a different stage. In yet another example, one release layer may be de-bonded by IR radiation while the other by chemical processes.

Figure 6:
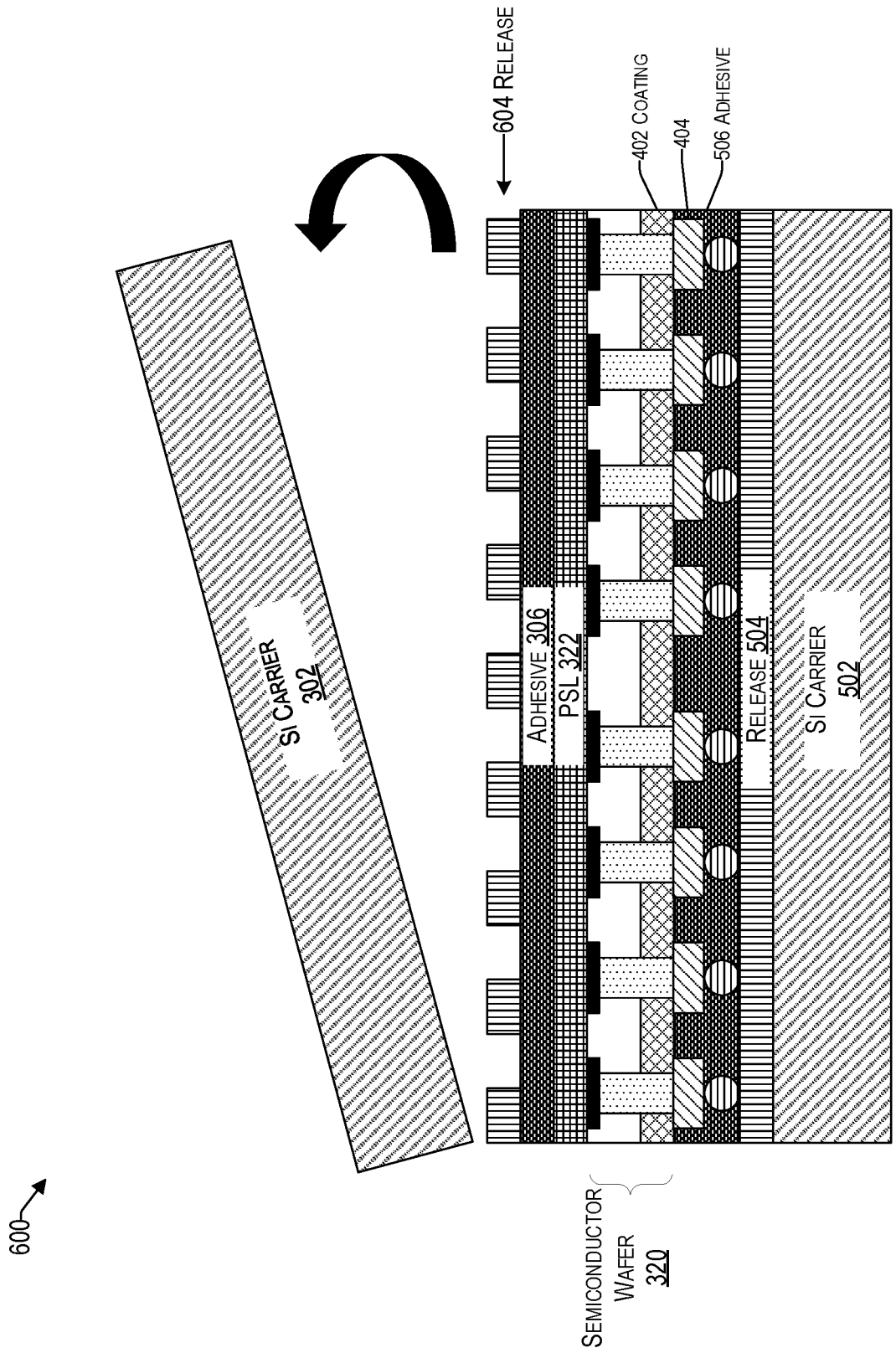
FIG. 6 illustrates a separation of the first carrier from the semiconductor wafer and the second carrier, consistent with an illustrative embodiment.

FIG. 6 illustrates a separation 600 of the first carrier 302 from the semiconductor wafer 320 and the second carrier 502, consistent with an illustrative embodiment. In various embodiments, chemical and/or laser techniques may be used to de-bond the first carrier from the remaining structure. For example, IR (i.e., mid IR) laser radiation can be applied through the first carrier 302 to the release layer 604 to release the first carrier 302 from the remaining structure of the semiconductor wafer 320. The IR radiation 910 is operative to break the bonds in the release layer 304 and de-bond the top of the semiconductor wafer 320 from the first carrier 302. The dashed release layer 604 indicates breakage in the release layer during the separation from the first carrier 302.

Figure 7:
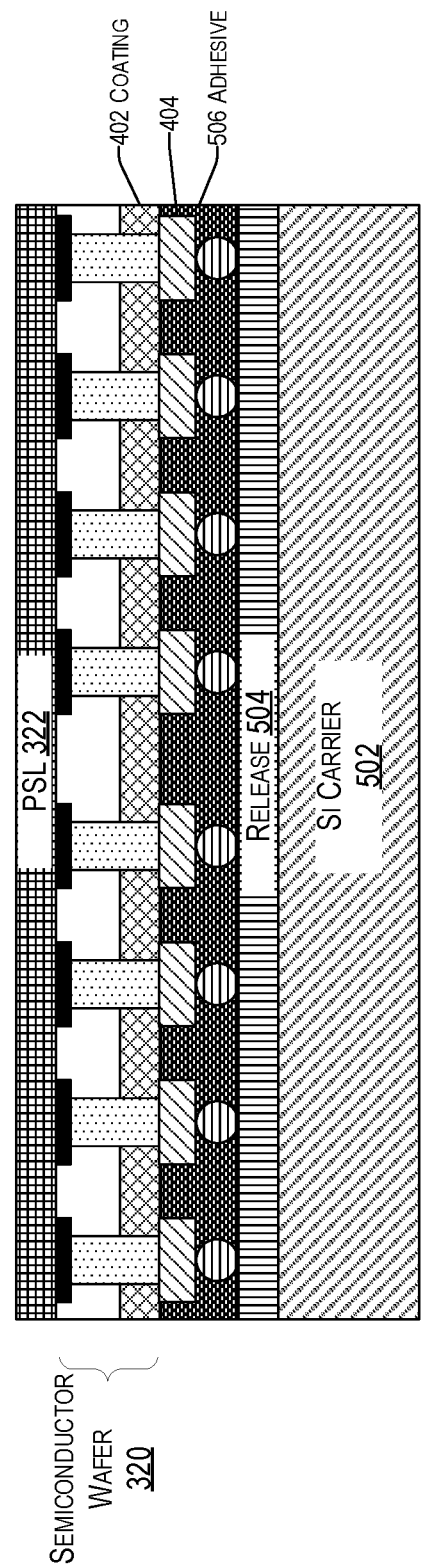
FIG. 7 illustrates the semiconductor structure of FIG. 6 with its first carrier structure removed, consistent with an illustrative embodiment.

FIG. 7 illustrates the semiconductor structure 600 of FIG. 6 with its first carrier structure 302 removed, consistent with an illustrative embodiment. Any remaining release layer 604 can be removed, for example, by a chemical etching process. The semiconductor wafer 320 is protected by the PSL 322. More specifically, the PSL 322 protects the top of the UBM, which may be copper (Cu), from corrosion during the entire process, including a final cleaning. In some embodiments, the PSL 322 is removed at a point of readiness for joining (e.g., when the semiconductor wafer 320 is coupled to another receiving semiconductor wafer 320 to provide a mechanical and electrical connection therewith. The Cu surface below the PSL is readily cleaned (by flux or other chemical approaches) for top die bond and assembly (B&A). The Cu surface is the top portion of the black metal pads on top of the TSVs.

Figure 8:
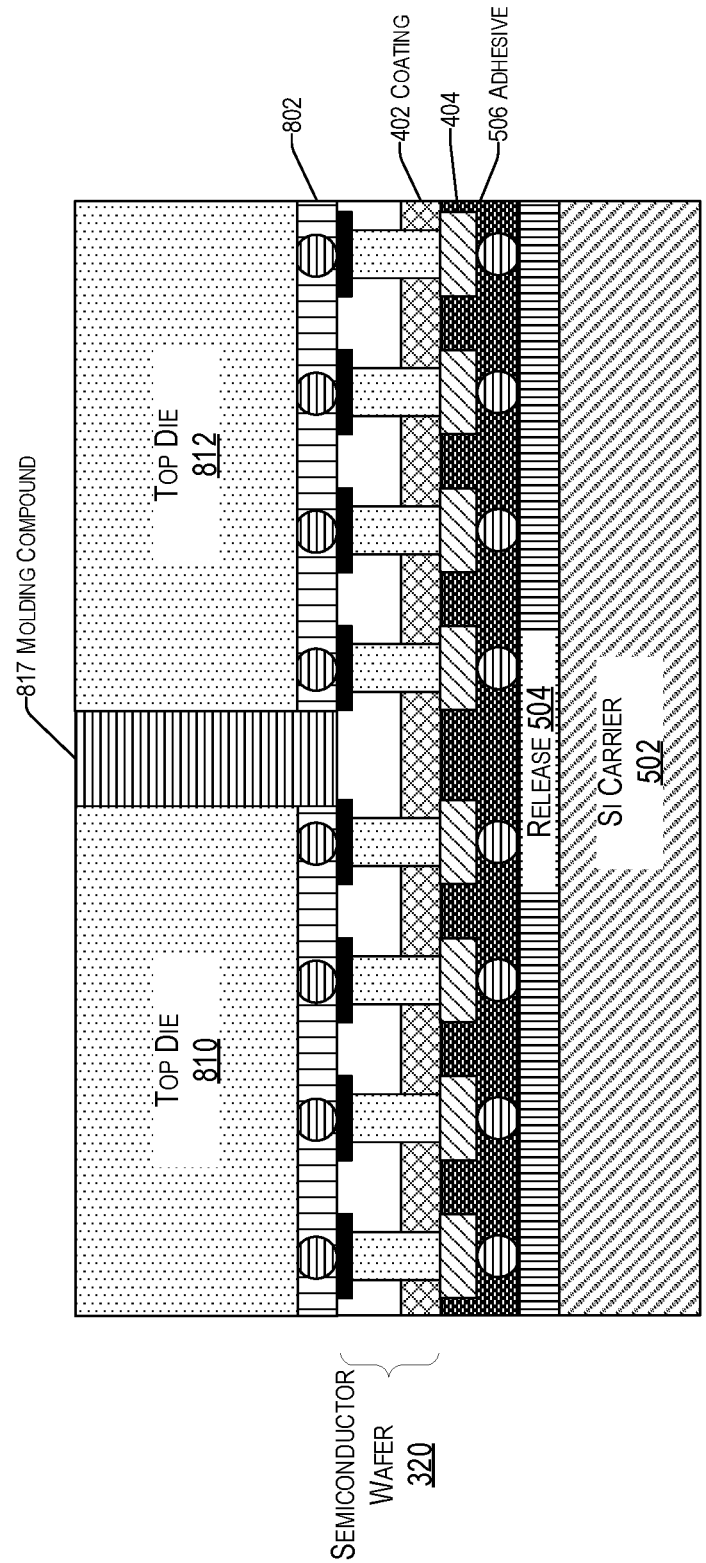
FIG. 8 illustrates a semiconductor structure having one or more die electrically connected to a semiconductor wafer, consistent with an illustrative embodiment.

FIG. 8 illustrates a semiconductor structure 800 having one or more die electrically connected to a semiconductor wafer 320, consistent with an illustrative embodiment. The bonding of the top die 810 and 812 may be performed as die to wafer (D2W), die to die (D2D), or a 3D die to laminate first, and then a top die to 3D die, or any combination thereof. The underfill material 802 is typically an epoxy that serves to encapsulate the solder structures and provide mechanical integrity to the interface; this underfill enables structural coupling of the top die to the bottom chiplet on the wafer. There is a molding compound 817 between the top die 810 and 812.

For example, in various embodiments, individual semiconductor devices, such as transistors, resistors, inductors, capacitors, resistors, etc., can be interconnected with wiring of the semiconductor wafer 320 through the BEOL wiring to the top die 810 and/or 812. Accordingly, electrical connectivity can be provided between the top die 810 and the semiconductor wafer 320. In this way, the semiconductor wafer 320 is able to communicate outside of the semiconductor wafer 320, to one or more semiconductors (e.g., top die 810 and/or 812) electrically connected thereto. Significantly, gold was not used for the processing of the UBM and the stacking of one or more semiconductor structures on top of one another. Indeed, the process may be repeated to create a stacked architecture having multiple levels that are all interconnected based on the teachings herein without the use of gold as a protective layer. Instead, the protection is provided by the PSL.

Figure 9:
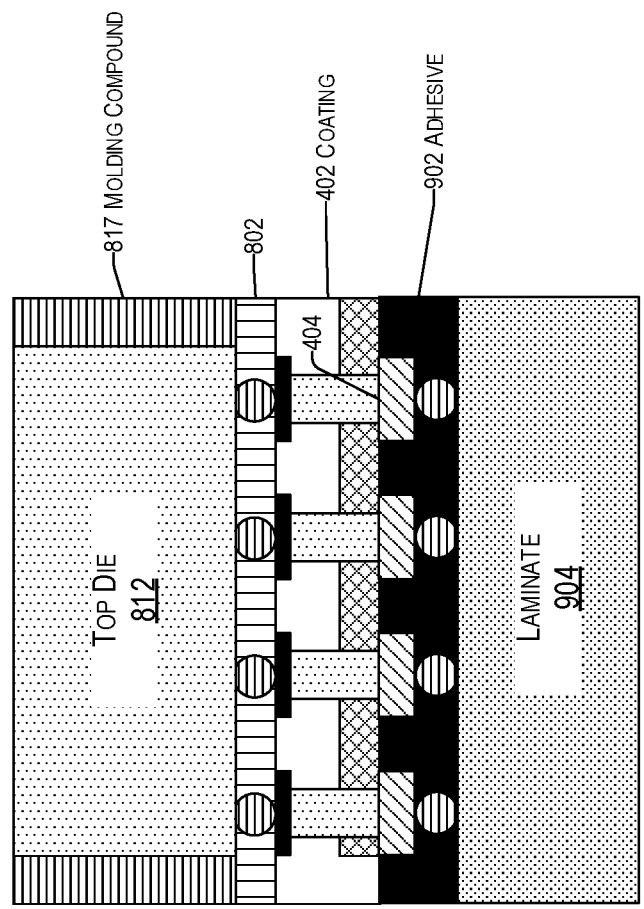
FIG. 9 illustrates a semiconductor structure having underfilling over molding, consistent with an illustrative embodiment.

FIG. 9 illustrates a semiconductor structure 900 having underfilling over molding, consistent with an illustrative embodiment. For example, the second carrier 502 is debonded from the semiconductor waver 320 by way of the release layer 504 (e.g., by way of a chemical and/or laser release). After dicing the dual die stack with overmolding is joined to packaging substrate such as an organic laminate 904.

While the manufacture of a single semiconductor wafer with a die layer on top is being shown for simplicity, it will be understood that any desired number of semiconductor wafers can be stacked based on the teachings herein. Further, while the term wafer is used for discussion purposes, it will be understood that diced chips can be used as well.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. An under-bump metallurgy (UBM) structure that is free of gold processing, comprising:
 a titanium layer on top of a far back of line (FBEOL) of a semiconductor;
 a first copper layer on top of the titanium layer; and
 a protective surface layer (PSL) on top of the first copper layer,
 wherein the UBM does not have a gold protective layer.

2. The UBM structure of claim 1, wherein the PSL is selective.

3. The UBM structure of claim 1, further comprising a second copper layer on top of the first copper layer and below the PSL.

4. The UBM structure of claim 3, further comprising a nickel layer on top of the first or second copper layer.

5. The UBM structure of claim 4, wherein a top copper layer is directly on top of the nickel layer.

6. The UBM structure of claim 1, wherein the PSL is configured to be removable before the UBM structure accepts a solder ball to connect to a second semiconductor structure.

7. The UBM structure of claim 6, wherein the PSL is selected from a group consisting of:
 titanium (Ti);
 titanium-tungsten (TiW);
 chromium (Cr);
 cobalt (Co);
 cobalt/tungsten/phosphorus alloy (CoWP); and
 benzotriazole (BTA).

8. The UBM structure of claim 1, wherein:
 the PSL is configured not to be removed before the UBM structure accepts a solder ball to connect to a second semiconductor structure; and
 the PSL is selected from a group consisting of:
  ruthenium (Ru);
  rhodium (Rh);
  iridium (Ir);
  osmium (Os);
  palladium (Pd); and
  platinum (Pt).

* * * * *